United States Patent [19]

Wyland et al.

[11] Patent Number: 5,679,975
[45] Date of Patent: Oct. 21, 1997

[54] CONDUCTIVE ENCAPSULATING SHIELD FOR AN INTEGRATED CIRCUIT

[75] Inventors: Christopher Paul Wyland, Santa Clara; Thomas Henry Templeton, Jr., Fremont, both of Calif.

[73] Assignee: Integrated Device Technology, Inc., Santa Clara, Calif.

[21] Appl. No.: 574,049

[22] Filed: Dec. 18, 1995

[51] Int. Cl.⁶ ............................................. H01L 23/552
[52] U.S. Cl. .............................. 257/659; 257/787
[58] Field of Search ............................ 257/659, 787

[56] References Cited

U.S. PATENT DOCUMENTS

| | | | |
|---|---|---|---|
| 4,107,555 | 8/1978 | Haas et al. | 257/659 |
| 5,270,488 | 12/1993 | Ono et al. | 257/659 |
| 5,350,943 | 9/1994 | Angerstein | 257/659 |

FOREIGN PATENT DOCUMENTS

| | | | |
|---|---|---|---|
| 62-4347 | 1/1987 | Japan | 257/659 |
| 2-14554 | 1/1990 | Japan | 257/659 |
| 3-171652 | 7/1991 | Japan | 257/659 |
| 3167868 | 7/1991 | Japan | 257/659 |
| 3-259552 | 11/1991 | Japan | 257/659 |
| 4-94560 | 3/1992 | Japan | 257/659 |
| 5-21655 | 1/1993 | Japan | 257/659 |

*Primary Examiner*—Mahshid D. Saadat
*Assistant Examiner*—S. V. Clark
*Attorney, Agent, or Firm*—Skjerven, Morrill, MacPherson, Franklin & Friel

[57] ABSTRACT

A conductive shield on the surface of an integrated circuit package improves the circuit and package performance. The conductive shield in the vicinity of the leads reduces lead inductance, thus increasing the frequency range of the package and reducing switching induced noise in digital circuits. The shield also blocks radio energy from entering or leaving the package through shielded area.

13 Claims, 4 Drawing Sheets

5,679,975

CONDUCTIVE ENCAPSULATING SHIELD FOR AN INTEGRATED CIRCUIT

FIELD OF THE INVENTION

This invention relates to semiconductor integrated circuits and more particularly this invention relates to integrated circuits in insulative packages and to the application of conductive shields to such packages.

BACKGROUND OF THE INVENTION

Many types of plastic integrated circuit packages are in common use. A number of these package types, for example dual in line packages (DIP) and quad packages, have an integrated circuit chip (die) located in a central area within a set of leads that are part of a lead frame. The leads are closely spaced in a plane and extend from their origin near the integrated circuit die towards the exterior of the package. Bond pads (electric terminals) on the integrated circuit die are connected, by bond wires or by other means, to individual leads of the lead frame.

As the complexity of integrated circuits has increased over the years, the number of leads has also increased. The increased number of leads has been accommodated in a limited area by reducing the lead cross section and the lead spacing within the leadframe. As the lead dimensions and spacing have been reduced, the lead inductance and the mutual inductance between leads has increased. In digital circuits, with large changes in current occurring during switching between logic levels, the increased lead inductance causes voltage drop in the current carrying lead and the increased mutual inductance causes noise spikes in adjacent leads.

Not only has the complexity of integrated circuits increased over the years, the speed has also increased, further increasing the switching noise. In addition, the noise margin has been reduced as the supply voltage has been reduced over time.

The combination of reduced lead dimensions and spacing, increased circuit speed, and reduced supply voltage, makes the modern integrated circuit more susceptible to noise induced malfunction than earlier generations of integrated circuits.

The plastic materials contacting the die and the leads in an integrated circuit package must be excellent electrical insulators. In general, good electrical insulators tend also to be good thermal insulators. The insulating plastics are likewise good thermal insulators and limit the maximum power which may be dissipated by an integrated circuit die in a plastic package.

The insulating plastic materials in integrated circuit packages are transparent to radio frequency electromagnetic radiation and consequently permit radiation from the die to exit the package into the surroundings and permit radiation to enter the package from the surroundings. The radio frequency power emitted by digital integrated circuits has increased as circuit size, frequency, and power have been increased in recent years. Modern plastic packaged microprocessors can even emit radio frequency energy at levels in excess of Federal Communication Commission standards.

SUMMARY OF THE INVENTION

In accordance with the present invention, an electrically conductive shield for an electrically insulative integrated circuit package and a method of forming such a shield are provided. The integrated circuit package includes an electrically insulative plastic body surrounding the die and an inner portion of the leads in the normal manner. The electrically conductive shield is located on a selected portion, or on selected portions, of the outer surface of the electrically insulative plastic body of the package.

The conductive shield, connected to a fixed voltage source and located above or below and in proximity to the leads, reduces the inductance and the mutual inductance of the leads and reduces the noise associated with the large current changes which occur during logic switching in digital circuits. The shield can be connected to the package ground lead or power supply lead or to any portion of the lead frame which will be connected to a fixed voltage source. Alternatively, the shield can be connected to an external ground or power supply line, during assembly of the plastic integrated circuit onto a printed circuit board or other final assembly. If the conducting shield is sufficiently large, it may function adequately to suppress noise without a fixed voltage connection.

The conductive shield, located above or below the integrated circuit die, prevents radio frequency radiation, originating from the die, from exiting the package through the shield to the surroundings, and prevents radio frequency electromagnetic radiation from the surroundings from entering the package through the shield.

The electrically conductive shield, because it has higher thermal conductivity than the insulating plastic surrounding the die, increases heat flow away from the die and thus increases the maximum allowable power dissipation limit of the packaged integrated circuit.

DETAILED DESCRIPTION OF THE INVENTION

Figure 1A:
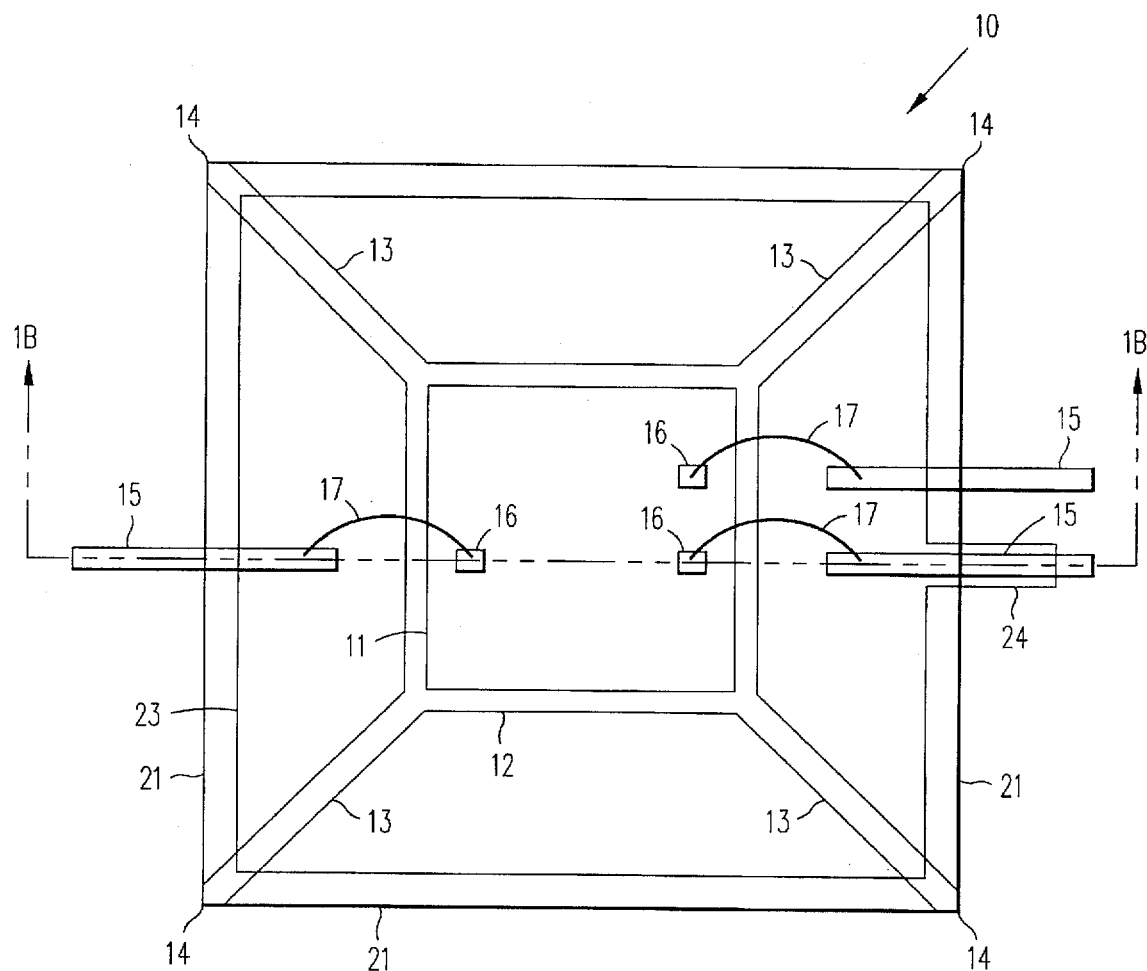
FIG. 1A is a plan of a first embodiment of the invention, a plastic packaged integrated circuit including an electrically conductive shield.
Figure 1B:
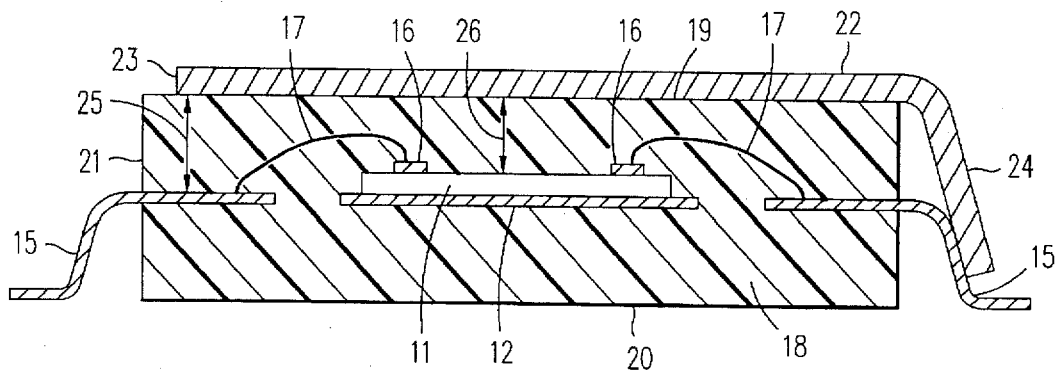
FIG. 1B is a cross section, taken at 1B—1B, plastic packaged integrated circuit of FIG. 1A.

FIGS. 1A and 1B show, respectively, a plan and a cross section, taken at the line 1B—1B, of a first embodiment of the invention. In a quad package 10 an integrated circuit die 11 is attached to a paddle 12. Paddle supports 13 extend from the paddle 12 to the corners 14 of the package 10, as shown in FIG. 1A. Leads 15 are in a plane surrounding the die 11 and extend from the vicinity of the die 11 to the exterior of the package 10. Bond pads 16 on the die 11 are connected by bond wires 17 to the leads 15. The die 11, the paddle 12, the paddle supports 13, the bond wires 17, and an inner portion of each lead 15 are encapsulated in and supported by the body 18 of the package 10. The body 18 is formed, of an electrically insulative plastic, by any acceptable method such as injection molding. The body 18 has a top surface 19, a bottom surface 20, and sides 21 as shown in FIG. 1B.

An electrically conductive shield 22 is attached to the top surface 19 of the body 18 of the package 10. In this embodiment the shield 22 is a sheet of copper foil attached by adhesive to the surface 19. The outer edge 23 of the shield 22 is shown located near the sides 21 of the plastic body 18 and may be located closer to or further away from the sides 21 than shown. A small portion 24 of the shield 22 extends beyond the side 21 of the package body 18 and is attached to a lead 15 by conductive adhesive or by solder or by other suitable means. The lead 15, to which the portion 24 of the shield 22 is attached, should be a fixed voltage lead such as a ground lead or a power supply lead. The shield 22, as shown in FIGS. 1A and 1B, is located above both the die 11 and the leads 15. A conductive shield, not shown, may also be attached to the bottom surface 20 of the plastic body 18.

The shield 22 reduces switching noise in digital integrated circuits by providing a constant voltage plane in proximity to the leads 15. The separation of the shield 22 from the leads 15 is shown by the two headed arrow 25. By proper choice of the separation 25 and the electrical properties of the insulative plastic material of the body 18, the inductance of each lead and the mutual inductance of adjacent leads can be reduced. The inductance of each of sixteen leads was measured without a shield and with a copper foil shield connected to ground in a package where the distance 25 was 0.5 mm (0.020 inch). Without a shield the average lead inductance was 4.69 nanohenries (nH) with standard deviation of 0.1 nH; with the shield the average lead inductance was 4.15 nH with standard deviation of 0.11 nH. The portion 24 of the shield 22, connected to a lead 15, provides connection of the shield 22 to a fixed voltage source, either power or ground. The shield 22 may, alternatively, after assembly of the integrated circuit onto a circuit board, be connected to a trace on the board, which in turn is connected to a fixed voltage source. Alternatively, if the surface 12 is sufficiently large, allowing a sufficiently large area shield 22, sufficient reduction of switching related noise may be obtained without connecting the shield 22 to a fixed voltage source.

The shield 22 also blocks radiated radio frequency energy from exiting or entering the package through that portion of the surface 19 covered by the shield. The shield 22, in this embodiment copper foil, reflects the radio frequency energy radiated by the die 11, thus preventing the radiated energy from exiting the package 10 through the shielded area. In typical packages, the distance 26 between the shield 22 and the die 11 is small enough that the solid angle through which radio frequency radiation can escape upwards is quite small. This is especially so when the shield not only covers the portion of the surface 19 immediately above the die but also extends close to the sides 21 of the package. The effectiveness of the shield in blocking radio frequency radiation decreases as the distance 26 between the shield 22 and the die 11 is increased, though the decrease in effectiveness is not appreciably large for the typical dimensions in a typical package.

The electrically conductive shield 22, in this embodiment copper foil, has high thermal conductivity and serves to conduct heat away from the heat source, the die 11. The increased thermal conductivity provided by the shield 22 allows the power dissipated in the die 11 to be increased, above the level dissipated without a shield, without exceeding the maximum allowed die temperature.

The conductive shield 22 may be made of conductive materials other than copper, for example, other metals, metal alloys, conductive plastic, conductive paint, or other suitable conductive material.

The electrically conductive shield 22 may be attached to body 18 of the package by means other than adhesives, for example, by thermal bonding, by a mechanical clamp, by a fastener or by snapping-on.

A conductive shield in the form of conductive paint may be applied by any of the devices known for applying paint, including a brush, a stamp, a roller, or a spray gun. A conductive paint shield may also be applied in the same manner as part numbers and date codes are applied. Conductive paint is commercially available.

Figure 2A:
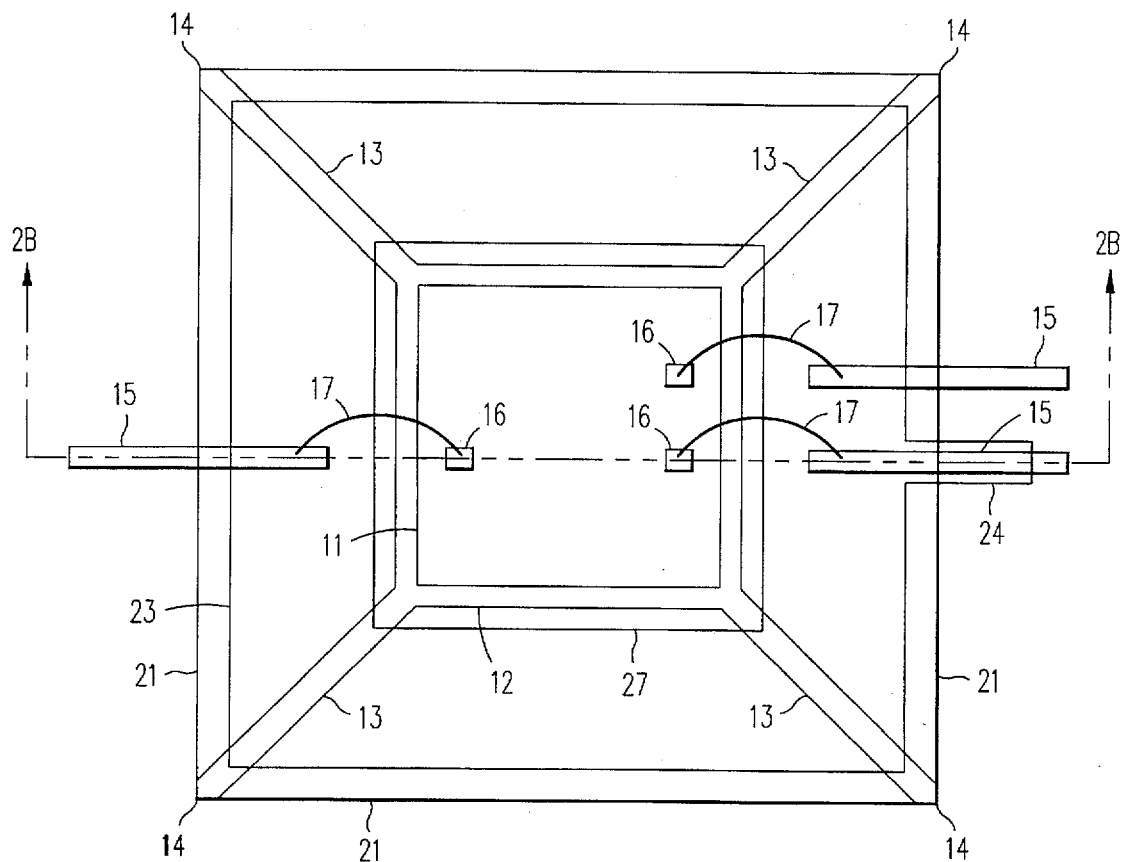
FIG. 2A is a plan of a second embodiment of the invention plastic packaged integrated circuit having an electrically conductive shield over the leads having
Figure 2B:
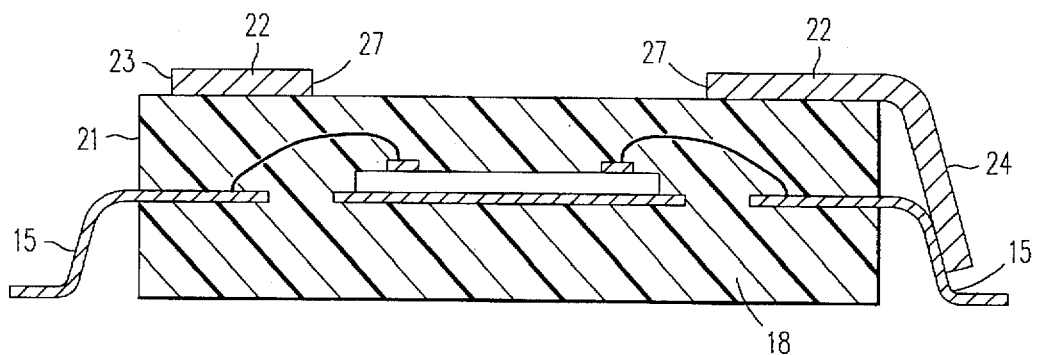
FIG. 2B is a cross section, taken at 2B—2B, of the plastic packaged integrated circuit of FIG. 2A.

FIGS. 2A and 2B show, respectively, a plan and a cross section, taken at 2B—2B, of a second embodiment of the invention. Part numbers have the same meaning as in FIGS. 1A and 1B. The shield 22 has an outer edge 23 and an inner edge 27 and is located mostly over the leads 15 rather than over the die 11. This configuration of the conductive shield 22 is primarily effective in reducing switching noise rather than blocking radiation to and from the die 11.

Alternatively, if the design requirement is to block radiation to and from the die, a conductive shield may be applied above the die and not above the leads.

If a shield having a certain conductivity is required over the die 11 and a shield having a different conductivity is required over the leads 15, then two distinct shields may be applied to the package. In FIGS. 2A and 2B the region between boundaries 23 and 27 may be occupied by one shield while the region inside boundary 27 may be occupied by a shield of different conductivity. Alternatively, a single shield comprising regions of different conductivity may be fabricated and applied to the package as a single unit. Alternatively, one of the two shields may be applied to the package in the form of a precut sheet attached to say the region between boundaries 23 and 27 while a second shield within boundary 27 may be applied as a layer of paint.

While FIGS. 1A, 1B, 2A and 2B show shields on the top surface 19 of the body 18 of the package, shields may also be applied on the bottom surface 20. Furthermore, shields may be applied to both top and bottom surfaces.

Figure 3A:
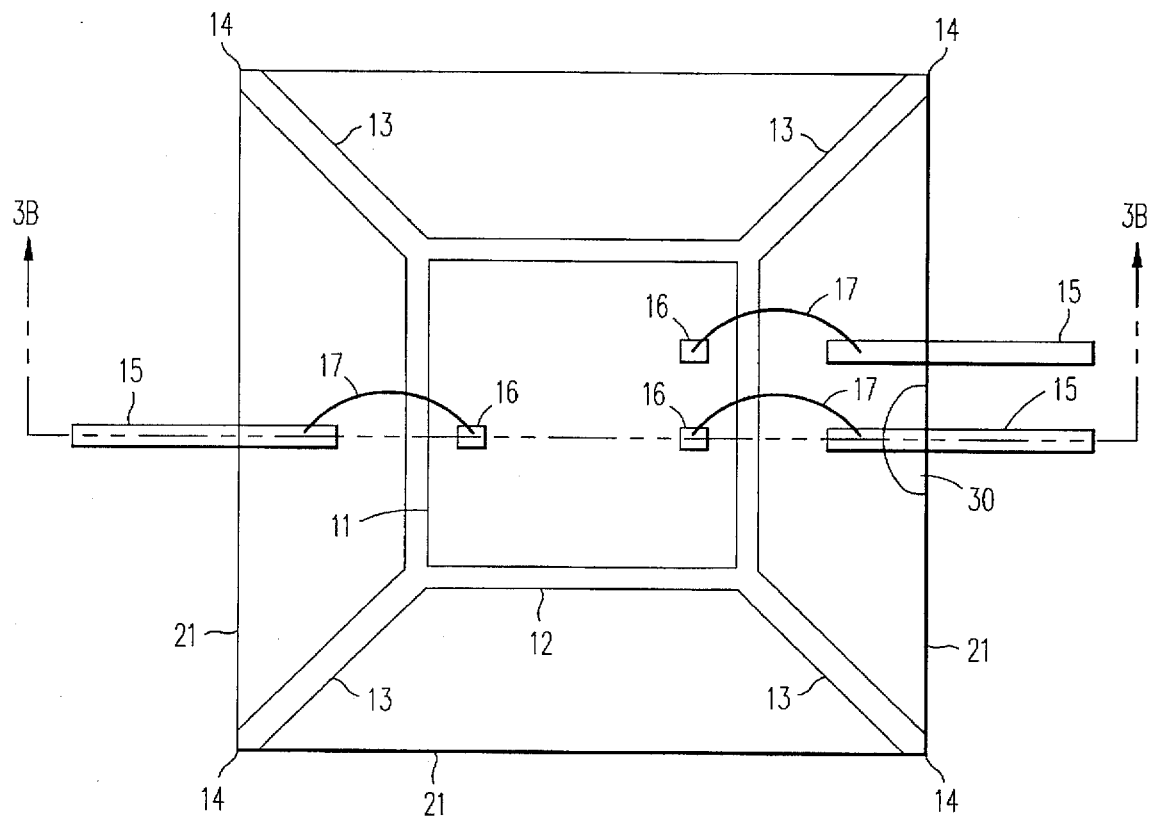
FIG. 3A is a plan of a third embodiment of the invention, a plastic packaged integrated circuit with electrically conductive shields formed by injection molding.
Figure 3B:
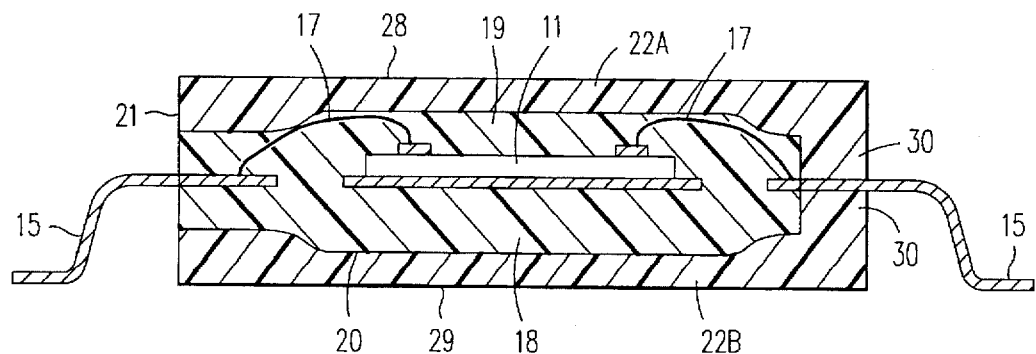
FIG. 3B is a cross section, taken at 3B—3B, of the plastic package of FIG. 3A.

FIGS. 3A and 3B show, respectively, a plan and a cross section of a third embodiment of the invention. The die 11, the paddle 12, a portion of each lead 15, and the bond wires 17 are encapsulated in the insulative plastic body 18 by any acceptable method such as injection molding. After the insulative plastic body 18 has been formed in a first mold, the device is placed in a second larger mold and the conductive shields 22A and 22B are formed in a second molding operation. A conductive molding compound is used to form the shields 22A and 22B. A conductive molding compound can be formulated by adding conductive powder, such as copper powder or aluminum powder, to epoxy. The top conductive shield 22A extends from the shield top surface 28 to the top surface 19 of the insulative body 18. The bottom conductive shield 22B extends from the shield bottom surface 29 to the bottom surface 20 of the insulative body 18. A portion 30 of each shield 22A and 22B extends to and electrically contacts a power or ground lead 15.

The top surface 19 of the body 18 is not flat in FIG. 3B, the portion of surface 19 over the die 11 being at a higher level relative to the portion of surface 19 over leads 15 to accommodate the bond wires 17, and the portion of surface 19 over the leads 15 being at a lower level (relative to the portion of surface 19 over die 11), in proximity to the leads, for noise suppression. The reverse comment applies to the bottom surface 20 of the body 18. Of course the surfaces 19 and 20 may be any other suitable shape and may even be flat.

The shields 22A and 22B perform the functions of, reducing lead inductance and associated noise, blocking radio frequency radiation, and improving heat dissipation. Whereas the highly conductive copper foil shield 22 in FIGS. 1A and 1B blocks radio waves by reflection, the less conductive plastic shields 22A and 22B in FIGS. 3A and 3B block radio waves by absorption.

Even though FIG. 3B shows a top conductive shield 22A and a bottom conductive shield 22B, either shield may be omitted. If the top shield 22A is omitted, however, energy radiates unhindered upward from the die. On the other hand, if the bottom shield 22B is omitted and if the paddle 12 is connected to a fixed voltage source, then the die 11 does not radiate through the bottom of the package.

The structure shown in FIGS. 3A and 3B can also be produced by forming the conductive shields 22A and 22B in a separate operation, injection molding for example, and subsequently attaching the shields to the body portion 18 with adhesive, for example.

Figure 4A:
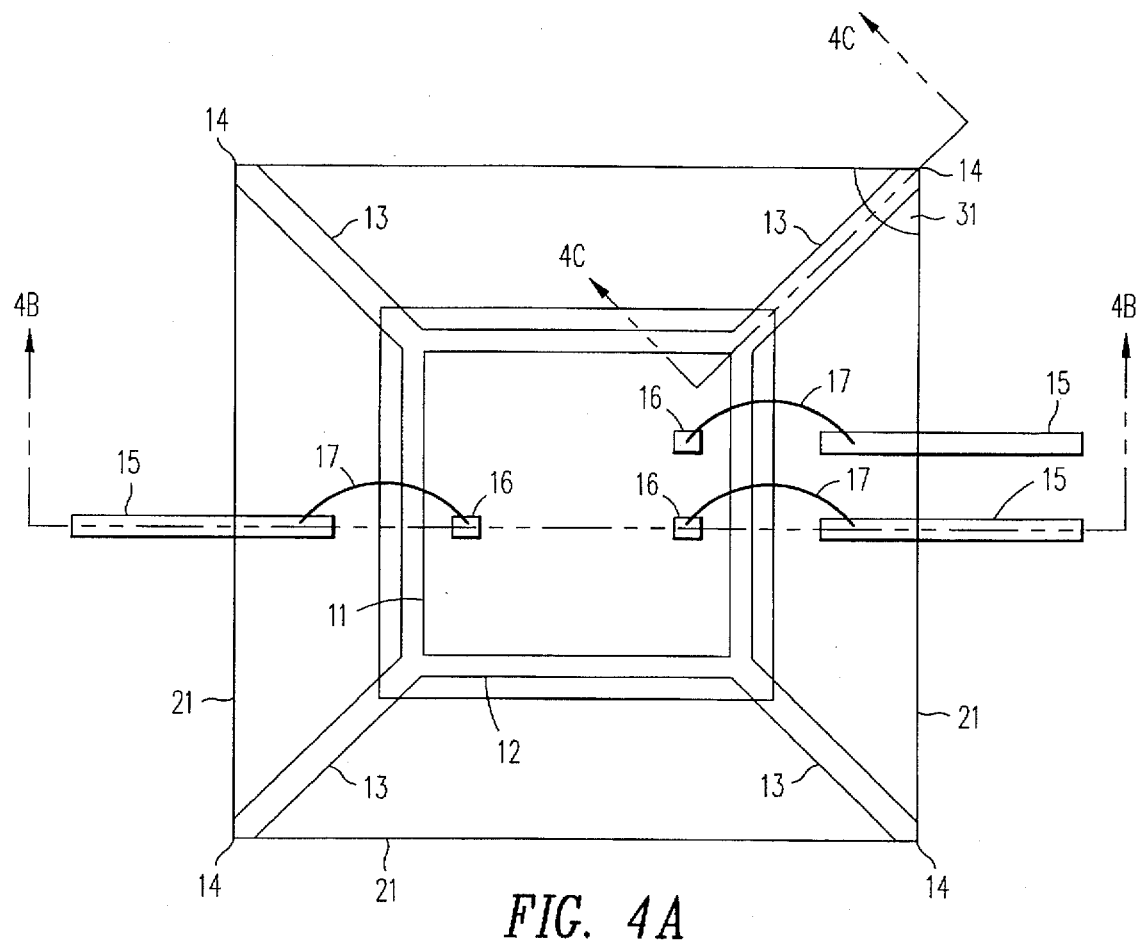
FIG. 4A is a plan of a fourth embodiment of the invention, a plastic packaged integrated circuit having electrically conductive shields in proximity to the package leads.
Figure 4B:
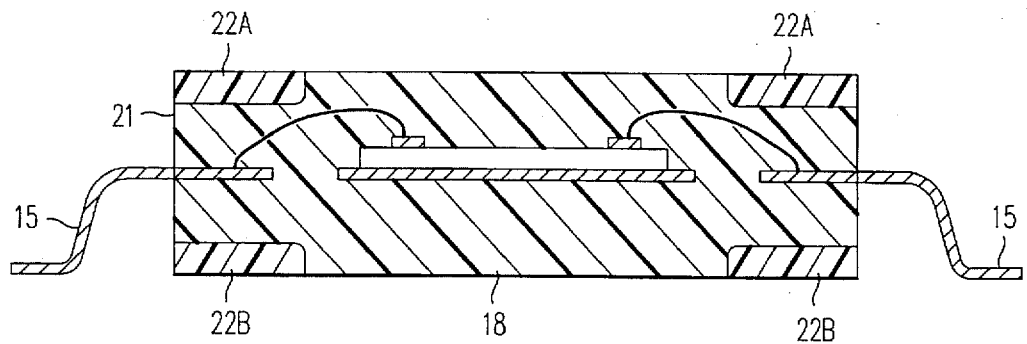
FIG. 4B is a cross section, taken at 4B—4B, of the plastic integrated circuit of FIG. 4A.
Figure 4C:
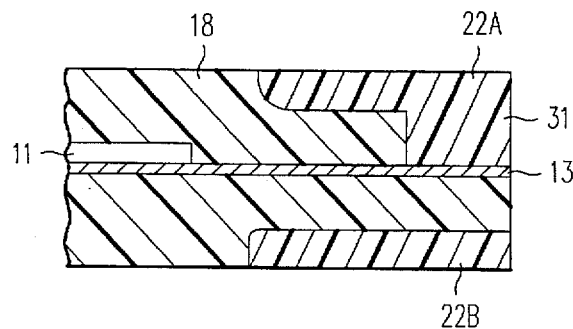
FIG. 4C is a cross section, taken at 4C—4C of the plastic integrated circuit of FIG. 4A.

FIGS. 4A, 4B and 4C show, respectively, a plan, a cross section taken at 4B—4B, and a cross section taken at 4C—4C, of a fourth embodiment of the invention. The die 11 is attached to the paddle 12. The paddle 12 has four supports 13, each extending to a corner 14 of the package 10. The die 11, the paddle 12, the paddle supports 13 and a portion of each lead 15 are enclosed in insulative plastic body 18. The body 18 is formed by injection molding in a first mold. The conductive shields 22A and 22B are formed by a second injection molding operation in a second larger mold. A conductive molding compound can be used in the second molding operation. The conductive shield 22A is located above the leads 15 and not above the die 11. The conductive shield 22B is located below the leads 15 and not below the die 11. This configuration provides reduction of switching noise and lead inductance primarily. FIG. 4C shows, in a cross section taken at 4C—4C of FIG. 4A, a portion of the die 11 on the paddle 12 and a paddle support 13 extending to a corner 14 of the package. The top conductive shield 22A extends down to and contacts the paddle support 13 as shown by 31 in FIGS. 4A and 4C. With this configuration, the top conductive shield 22A can be connected to a constant voltage source through the paddle 12 and the paddle support 13.

Clearly, the conductive shields 22A and 22B, instead of extending along all four sides 19 of the package as shown in FIG. 4A could extend along a lesser portion of the sides 19 as needed. Furthermore, the combination of upper and lower shields may extend along the entire length of all four sides 19 of the package 10 even though neither the upper nor the lower shield does so alone.

In the above examples a quad plastic package is discussed for illustrative purposes, however the invention is not limited to the quad packages. The invention may be used with insulative package materials other than plastic. The invention may also be used with multi-die packages. The scope of the invention is defined by the following claims.

What is claimed is:

1. A packaged integrated circuit comprising:
    an integrated circuit die comprising bond pads;
    a plurality of leads extending away from the integrated circuit die;
    means for connecting the bond pads to the leads;
    an insulative member encapsulating the integrated circuit die, the means for connecting, and an inner portion of the leads, the insulative member having an outer surface including a first portion located above the leads and a second portion located above the integrated circuit die; and
    a conductive shield attached to the outer surface of the insulative member wherein the conductive shield covers only the first portion of the outer surface of the insulative member.

2. The packaged integrated circuit of claim 1, wherein the conductive shield comprises a metal layer.

3. The packaged integrated circuit of claim 1, wherein the conductive shield comprises a metal alloy layer.

4. The packaged integrated circuit of claim 1, wherein the conductive shield comprises conductive paint.

5. The packaged integrated circuit of claim 1, wherein the conductive shield comprises a molding compound containing a conductive filler.

6. The packaged integrated circuit of claim 1, further comprising means for connecting the conductive shield to a fixed voltage source.

7. The packaged integrated circuit of claim 6, wherein the means for connecting the conductive shield to a fixed voltage source comprises a package lead.

8. A method for manufacturing an integrated circuit comprising the steps of:
    providing an integrated circuit die comprising bond pads;
    providing a plurality of leads extending away from the integrated circuit die;
    connecting the bond pads to the leads;
    forming for the integrated circuit an insulative package body, the insulative package body having an outer surface, wherein a first portion of the outer surface is located above the leads and a second portion of the outer surface is located above the integrated circuit die; and forming a conductive shield on a first portion of the outer surface of the insulative package body.

9. The packaged integrated circuit of claim 1, further comprising:
    a lower conductive shield attached to the outer surface of the insulative member wherein the lower conductive shield covers a portion of the outer surface of the insulative member below the leads.

10. An integrated circuit package having an integrated circuit die and a plurality of leads extending away from the integrated circuit die, the integrated circuit package further comprising:
    an electrically insulative package body surrounding the integrated circuit die, the electrically insulative package body having an outer surface including a first portion located above the leads and a second portion located above the integrated circuit die;
    a first conductive shield on the first portion of the outer surface, the first conductive shield having a first conductivity; and
    a second conductive shield on the second portion of the outer surface, the second conductive shield having a second conductivity different from the first conductivity.

11. The integrated circuit package of claim 10, wherein the first conductive shield and the second conductive shield form a single shield.

12. An integrated circuit package having an integrated circuit die and a plurality of leads extending away from the integrated circuit die, the integrated circuit package further comprising:

an electrically insulative package body surrounding the integrated circuit die, the electrically insulative package body having an outer surface including a first portion located above the leads and a second portion located above the integrated circuit die;

a first conductive shield on the first portion of the outer surface; and a second conductive shield on the second portion of the outer surface.

13. The integrated circuit package of claim 12, wherein the first conductive shield and the second conductive shield have different conductivities.

* * * * *